(12) United States Patent
Iyer

(10) Patent No.: US 6,365,530 B1
(45) Date of Patent: Apr. 2, 2002

(54) TECHNIQUES FOR IMPROVING ADHESION OF SILICON DIOXIDE TO TITANIUM

(75) Inventor: Ravi Iyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/645,958

(22) Filed: Aug. 24, 2000

Related U.S. Application Data

(62) Division of application No. 08/744,298, filed on Nov. 6, 1996, now Pat. No. 6,144,098, which is a continuation of application No. 08/228,054, filed on Apr. 15, 1994, now Pat. No. 5,624,868.

(51) Int. Cl.[7] .................... H01L 21/31; H01L 21/469
(52) U.S. Cl. .................... 438/785; 438/778; 438/762
(58) Field of Search ................ 438/785, 762, 438/763, 778

(56) References Cited

U.S. PATENT DOCUMENTS 5,164,331 A * 11/1992 Lin et al. .................... 437/192
5,314,843 A * 5/1994 Yu et al. ..................... 437/225
5,346,600 A * 9/1994 Nieh et al. ................ 204/192.3
5,508,881 A * 4/1996 Stevens ..................... 361/305

* cited by examiner

Primary Examiner—Richard Elms
Assistant Examiner—Brad Smith

(57) ABSTRACT

The present invention is described in several embodiments depicting structures and methods to form these structures. A first embodiment is a structure having a silicon dioxide film bonded to a metal film comprising: a metal nitride film bonded to the metal film; and the silicon dioxide film bonded to the metal nitride film. A second embodiment is a structure having a silicon dioxide film bonded to a metal film comprising: a metal oxide film bonded to the metal film; and the silicon dioxide film bonded to the metal oxide film. A third embodiment is a structure having a silicon dioxide film bonded to a metal film comprising: a metal/oxide/nitride film bonded to the metal film; and the silicon dioxide film bonded to the metal/oxide/nitride film.

16 Claims, 6 Drawing Sheets

TECHNIQUES FOR IMPROVING ADHESION OF SILICON DIOXIDE TO TITANIUM

PRIORITY INFORMATION

This is a divisional to U.S. patent application Ser. No. 08/744,298, filed Nov. 6, 1996 U.S. Pat. No. 6,144,098, which is a continuation to Ser. No. 08/228,054 filed Apr. 15, 1994 now U.S. Pat. No. 5,624,868, issued Apr. 29, 1997.

FIELD OF THE INVENTION

This invention relates to a semiconductor structure and fabrication process and more particularly to techniques for forming a structure that provides adhesion between silicon dioxide and titanium.

BACKGROUND OF THE INVENTION

During semiconductor fabrication it is common to use silicon dioxide ($SiO_2$) as an insulator between metal layers due to its superior dielectric properties. It is typical to form a titanium/aluminum/titanium (Ti/Al/Ti) stack for use as a metal1 layer. Over this metal1 stack a thick film of plasma $SiO_2$ is deposited. Usually before a metal2 layer is deposited on the dielectric, topography variations existing on the dielectric are smoothed out by planarization techniques such as chemical-mechanical polishing (CMP).

Unfortunately, the polishing technique by its very nature induces a lot of stress at the interface between the metal1 layer and the dielectric layer. Extensive peeling of the dielectric is observed if the adhesion between the metal and dielectric is poor, which is highly undesirable.

The present invention addresses the poor adhesion that can exist between a metal layer and a dielectric layer in the several embodiments described hereinafter.

SUMMARY OF THE INVENTION

A first embodiment of the present invention is a structure having a silicon dioxide film bonded to a metal film comprising:

a metal nitride film bonded to the metal film; and the silicon dioxide film bonded to said metal nitride film.

The structure of the first embodiment is formed by a semiconductor fabrication process for adhering silicon dioxide to metal comprising the steps of:

cleaning the surface of the metal;

converting the cleaned metal surface to a metal nitride; and forming silicon dioxide superjacent to the metal nitride.

A second embodiment of the present invention is a structure having a silicon dioxide film bonded to a metal film comprising:

a metal oxide film bonded to the metal film; and the silicon dioxide film bonded to the metal oxide film.

The structure of the second embodiment is formed by a semiconductor fabrication process for adhering silicon dioxide to metal comprising the steps of:

cleaning the surface of the metal;

forming an oxygen deficient film on the metal surface; and forming a silicon dioxide layer over the oxygen deficient film, thereby causing a chemical reaction between the oxygen deficient film and the metal to form an interfacial metal oxide bonding layer therebetween.

A third embodiment of the present invention is a structure having a silicon dioxide film bonded to a metal film comprising:

a metal/oxide/nitride film bonded to the metal film; and the silicon dioxide film bonded to the metal/oxide/nitride film.

The structure of the third embodiment is formed by a semiconductor fabrication process for adhering silicon dioxide to metal comprising the steps of:

cleaning the surface of the metal;

converting the cleaned metal surface to a metal nitride;

forming an oxygen deficient film on the nitrided metal surface; and forming a silicon dioxide layer over the oxygen deficient film, thereby causing a chemical reaction between the oxygen deficient film, the metal nitride and the metal to form an interfacial metal/oxide/nitride bonding layer therebetween.

BRIEF DESCRIPTION OF THE DRAWINGS

FIGS. 1b–1d represent composite cross-sectional views of an in-process substrate portion depicting the resulting structure following the process flow of FIG. 1a;

FIGS. 2b–2d represent composite cross-sectional views of an in-process substrate portion depicting the resulting structure following the process flow of fire 2a;

FIGS. 3b–3e represent composite cross-sectional views of an in-process substrate portion depicting the resulting structure following the process flow of FIG. 3a.

DETAILED DESCRIPTION OF THE INVENTION

A first embodiment of the present invention is depicted in FIGS. 1a–1d, a second embodiment of the present invention is depicted in FIGS. 2a–2d, and a third embodiment of the present invention is depicted in FIGS. 3a–3e.

Figure 1A:
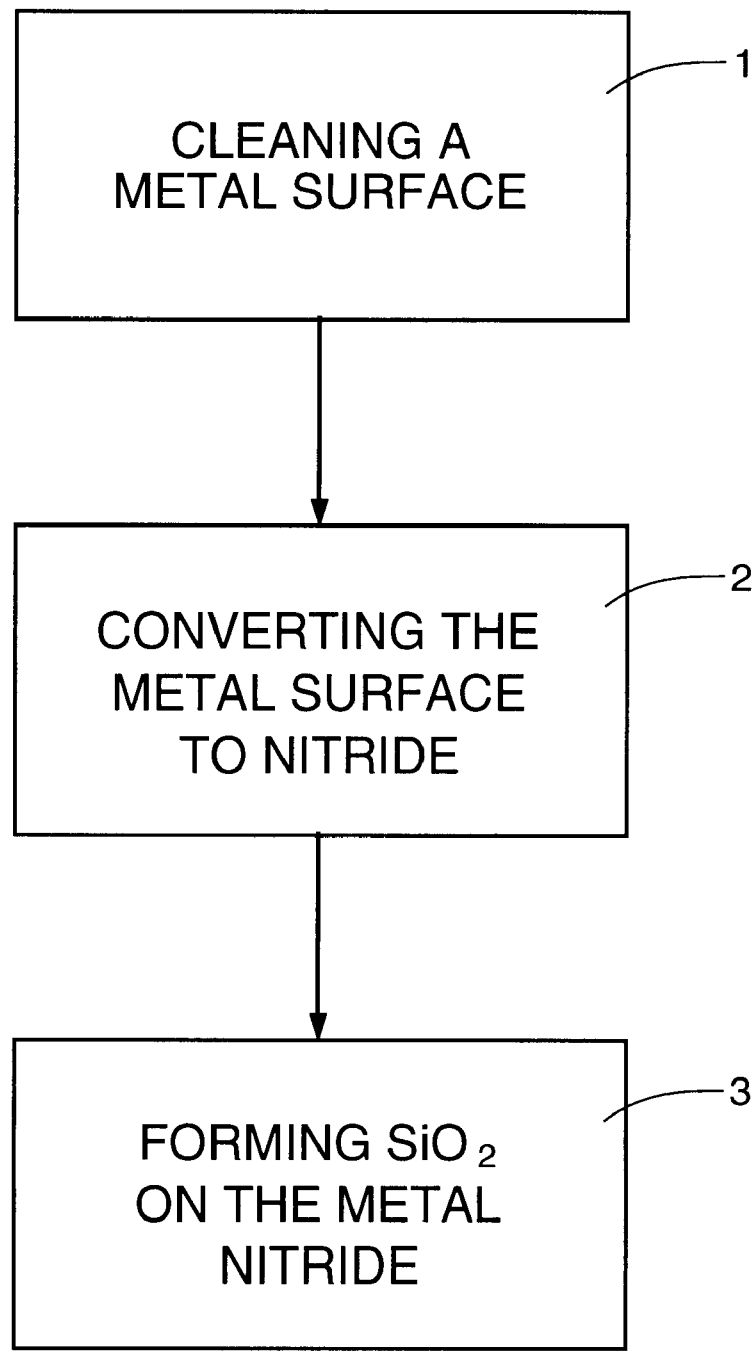
FIG. 1a represents a process flow diagram of the first embodiment.

In a first embodiment and referring now to FIG. 1a, the general processing flow is outlined. First the surface of a metal is cleaned (as represented by box 1) by such methods as subjecting the metal to an argon plasma. When subjecting the metal to argon plasma, the desired result is accomplished by performing a sputter clean at a pressure of approximately 30 mTorr, at an energy of approximately 200 W RF power, at an argon flow rate of approximately 50 sccm and for a time period of approximately 10 sec. Even better results are obtained when employing a magnetic field of approximately 60 Gauss during the sputter clean. However, the range for each of the parameters can vary. For example, the sputter clean can be performed at a pressure range of 10–50 mTorr, at an energy range of 100–500 W RF power, at an argon flow of 20–70 sccm and for a time period of 5–50 sec.

Next, the metal surface is converted to nitride (as represented by box 2) by such methods as subjecting the cleaned metal surface to plasma nitridation comprising $N_2+NH_3$ plasma. When subjecting the metal surface to plasma nitridation, the metal surface is placed in an $N_2/NH_3$ ambient for approximately 15 sec, at a pressure of approximately 4.5 Torr, at a temperature of approximately 360° C. and at an energy of approximately 350 W RF power.

It is preferred that the $N_2:NH_3$ ratio is 10:1, however it is sufficient if the ratio ranges from 2:1 to 50:1.

Finally an $SiO_2$ layer is formed on the metal nitride (represented by box 3) by methods known to those skilled in the art.

Figure 1B:
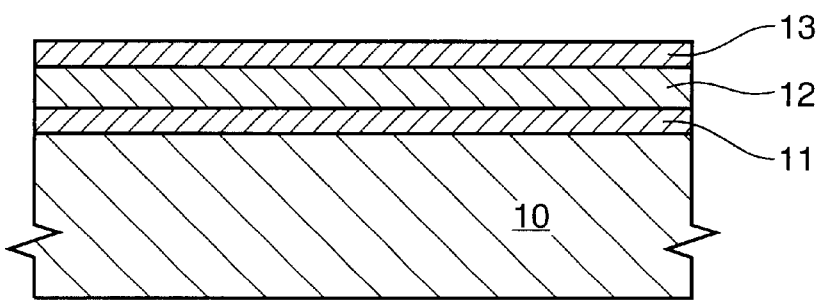
Figure 1C:
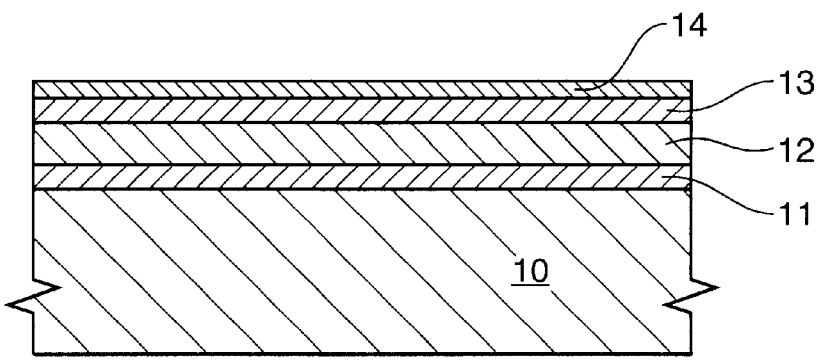
Figure 1D:
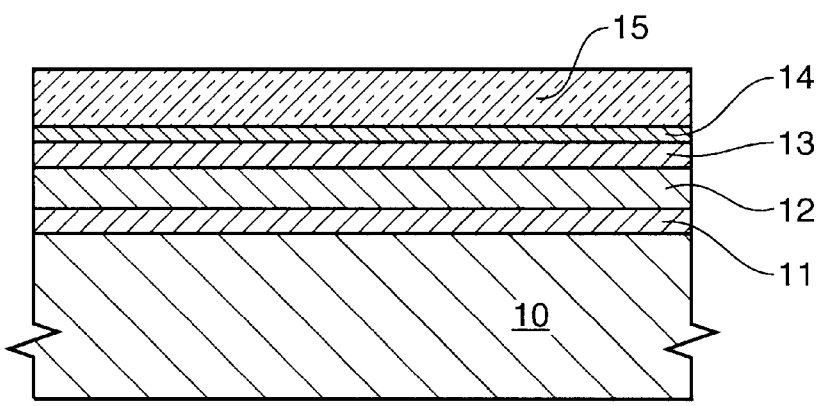

A specific example resulting from the process steps of FIG. 1a is depicted in FIGS. 1b–1d. Referring now to FIG. 1b, a metal stack comprising Ti layer 11, Al/Cu layer 12 and Ti layer 13 has been formed on a supporting substrate 10 (supporting layer 10 represents any material used in a fabrication process that the metal stack can be formed upon). Ti layer 13 is then cleaned by a method such as the one described for FIG. 1a.

Referring now to FIG. 1c, the cleaned surface of Ti layer 13 is exposed to plasma nitridation by a method such as the one described for FIG. 1a. The resulting nitridation of the surface of Ti layer 13 forms TiN layer 14. As FIG. 1c shows, though a portion of the Ti is converted to TiN layer 14, a non-converted portion of the Ti remains as depicted by the remaining Ti layer 13.

Referring now to FIG. 1d, an $SiO_2$ layer 15 is formed on the TiN layer 14 by methods known to those skilled in the art. TiN layer 14 is the layer that adheres $SiO_2$ layer 15 to Ti layer 13.

Figure 2A:
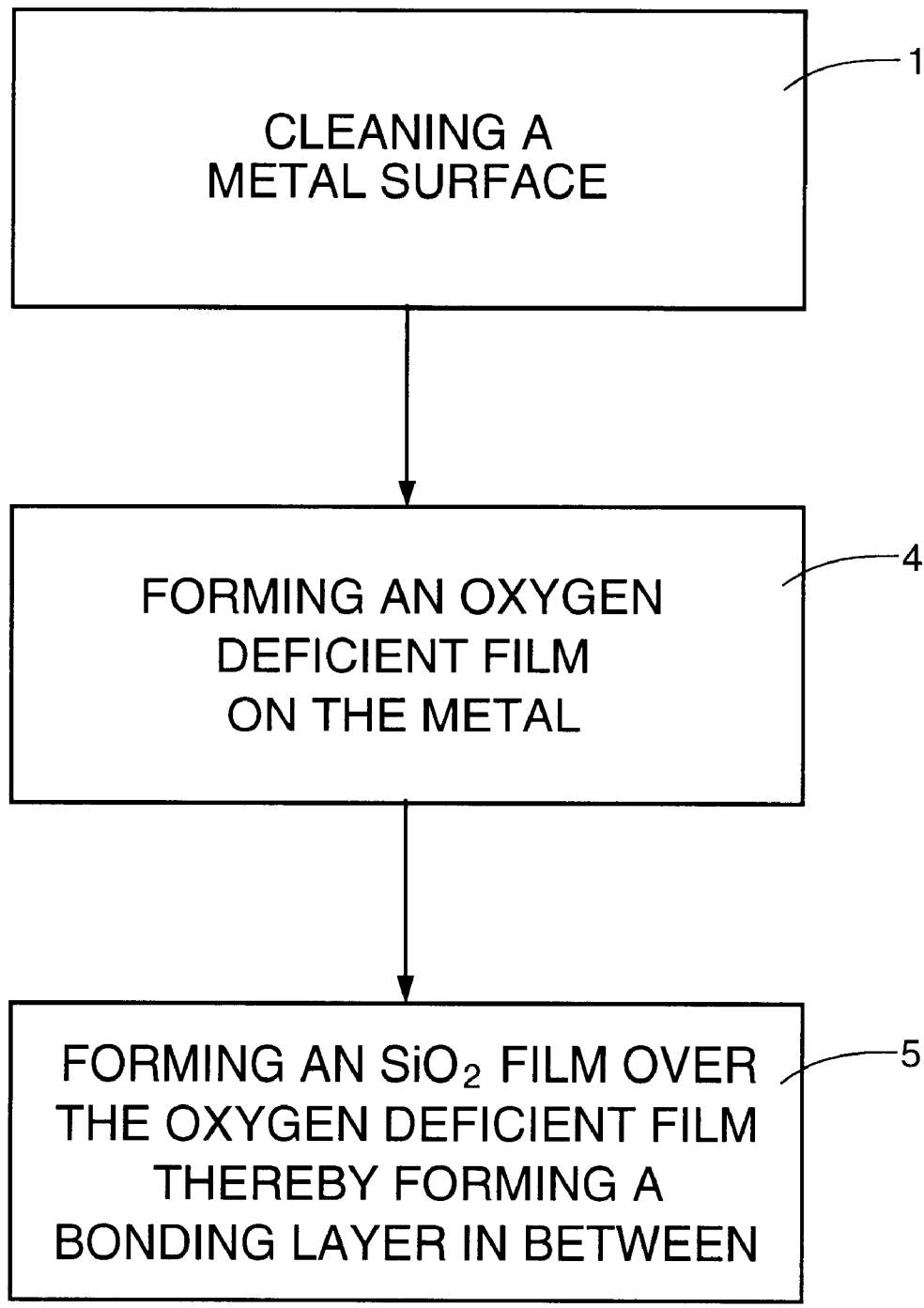
FIG. 2a represents a process flow diagram of the second embodiment.

In a second embodiment and referring now to FIG. 2a, the general processing flow is outlined First the surface of a metal is cleaned (as represented by box 1) by such methods as subjecting the metal to an argon plasma. When subjecting the metal to argon plasma, the desired result is accomplished by a performing a sputter clean at a pressure of approximately 30 mTorr, at an energy of approximately 200 W RF power, at an argon flow rate of approximately 50 sccm and at a time period of approximately 10 sec. Even better results are obtained when employing a magnetic field of approximately 60 Gauss during the sputter clean. However, the range for each of the parameters can vary. For example, the sputter clean can be performed at a pressure range of 10–50 mTorr, at an energy range of 100–500 W RF power, at an argon flow of 20–70 sccm and for a time period of 5–50 sec.

Next an oxygen deficient film is formed on the metal surface as represented in box 4. For example, the oxygen deficient film comprises $SiO_x$ that is formed by the plasma dissociation of tetraethyl orthosilicate (TEOS) where x varies from 1–2 (x is less than 2 to be classified as oxygen deficient, or in this embodiment, x ranges from 1 to less than 2).

Finally, an $SiO_2$ film is formed over the oxygen deficient film (represented by box 5) thereby forming a bonding layer between the oxygen deficient film and the $SiO_2$ film.

Figure 2B:
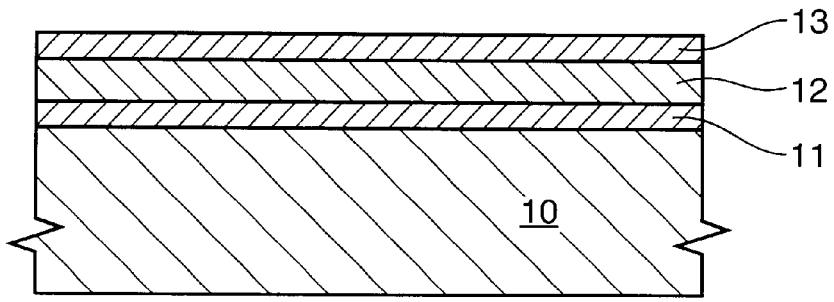
Figure 2C:
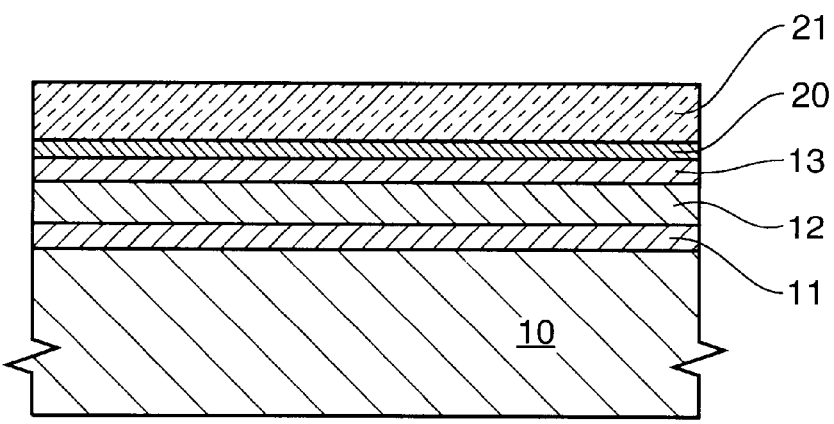
Figure 2D:
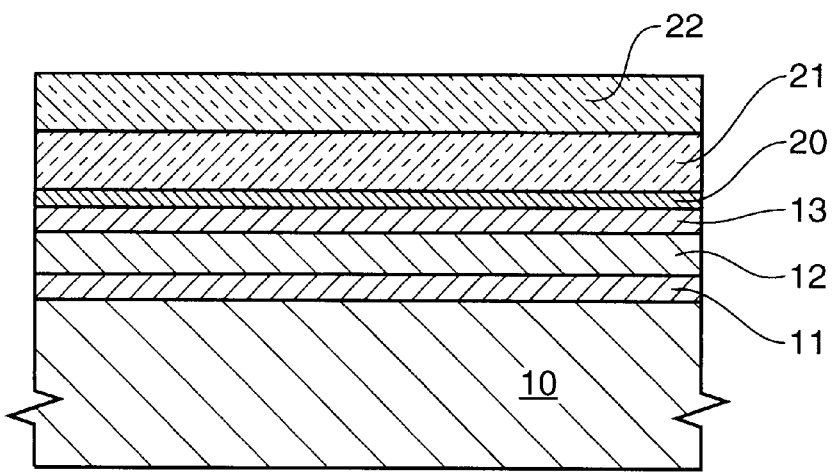

A specific example resulting from the process steps of FIG. 2a is depicted in FIGS. 2b–2d. Referring now to FIG. 2b, a metal stack comprising Ti layer 11, Al/Cu layer 12 and Ti layer 13 has been formed on a supporting substrate 10 (supporting layer 10 represents any material used in a fabrication process that the metal stack can be formed upon). Ti layer 13 is then cleaned by a method such as the one described for FIG. 2a.

Referring now to FIG. 2c, an $SiO_x$ layer 21 is formed over the cleaned surface of Ti layer 13 by the plasma dissociation as described for FIG. 2a. During this dissociation, not only is $SiO_x$ layer 21 formed over the cleaned surface of Ti layer 13, but Ti layer 13 is oxidized to form $TiO_2$ layer 20 that adheres Ti layer 13 to $SiO_x$ layer 21.

Referring now to FIG. 2d, $SiO_2$ layer 22 is formed on $SiO_x$ layer 21 by methods known to those skilled in the art.

Figure 3A:
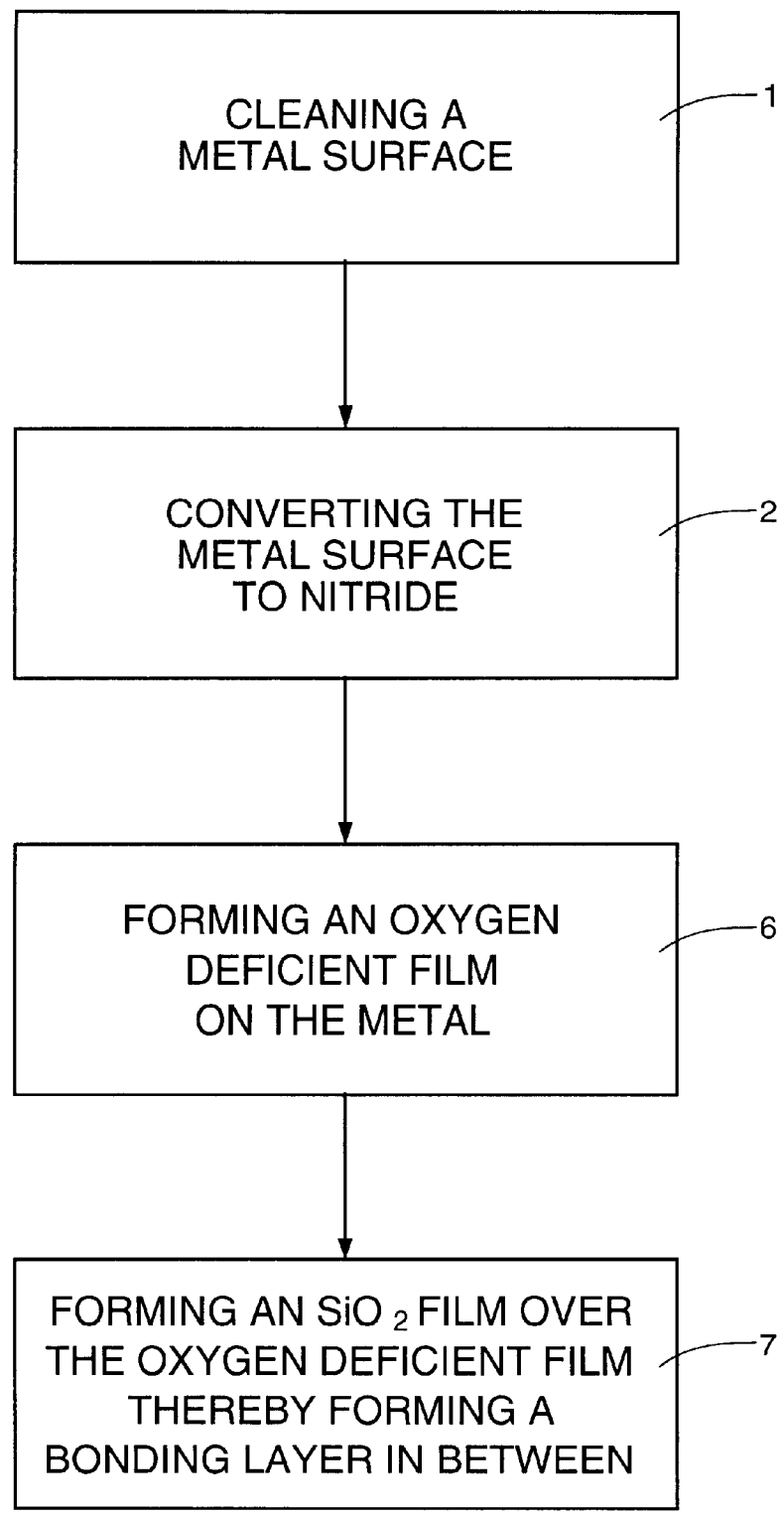
FIG. 3a represents a process flow diagram of the third embodiment.

A third embodiment is a combination of the first two embodiments and referring now to FIG. 3a, the general processing flow is outlined. First the surface of a metal is cleaned by such methods as subjecting the metal to an argon plasma as represented by box 1. When subjecting the metal to argon plasma, the desired result is accomplished by a performing a sputter clean at a pressure of approximately 30 mTorr, at an energy of approximately 200 W RF power, at an argon flow rate of approximately 50 sccm and at a time period of approximately 10 sec. Even better results are obtained when employing a magnetic field of approximately 60 Gauss during the sputter clean. However, the range for each of the parameters can vary. For example, the sputter clean can be performed at a pressure range of 10–50 mTorr, at an energy range of 100–500 W RF power, at an argon flow of 20–70 sccm and for a time period of 5–50 sec.

Next, the metal surface is converted to nitride (as represented by box 2) by such methods as subjecting the cleaned metal surface to plasma nitridation comprising $N_2+NH_3$ plasma. When subjecting the metal surface to plasma nitridation the metal surface is placed in an $N_2/NH_3$ ambient for approximately 15 sec, at a pressure of approximately 4.5 Torr, at a temperature of approximately 360° C. and at an energy of approximately 350 W RF power. It is preferred that the $N_2:NH_3$ ratio is 10:1, however it is sufficient if the ratio range is form 2:1 to 50:1.

Next, an oxygen deficient film is formed on the metal nitride as represented in box 6. For example, the oxygen deficient film comprises $SiO_x$ that is formed by the plasma dissociation of TEOS (where x varies from 1–2).

And finally a $SiO_2$ film is formed over the oxygen deficient film (represented by box 7) thereby forming a bonding layer between the oxygen deficient film and the $SiO_2$ film.

Figure 3B:
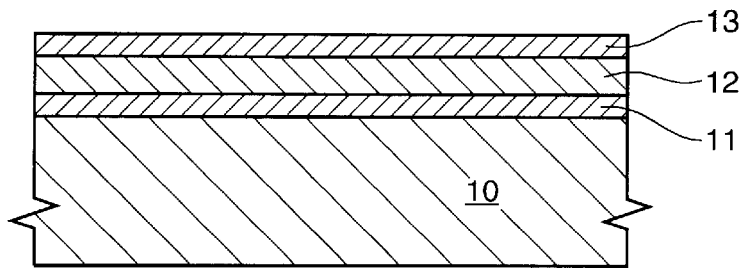

A specific example resulting from the process steps of FIG. 3a is depicted in FIGS. 3b–3e. Referring now to FIG. 3b, a metal stack comprising Ti layer 11, Al/Cu layer 12 and Ti layer 13 has been formed on a supporting substrate 10 (supporting layer 10 represents any material used in a fabrication process that the metal stack can be formed upon). Ti layer 13 is then cleaned by a method such as the one described for FIG. 3a.

Figure 3C:
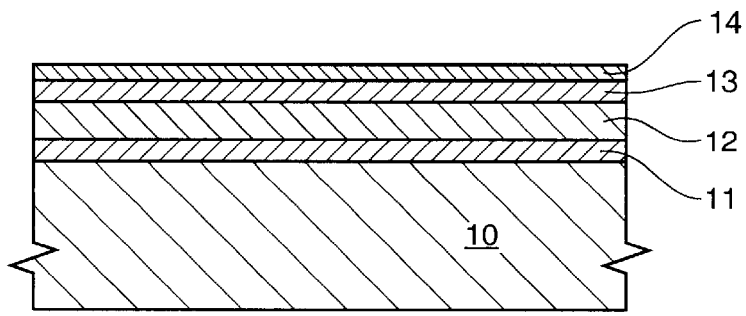

Referring now to FIG. 3c, the cleaned surface of Ti layer 13 is exposed to plasma nitridation by a method such as the one described for FIG. 3a. The resulting nitridation of the surface of Ti layer 13 forms TiN layer 14.

Figure 3D:
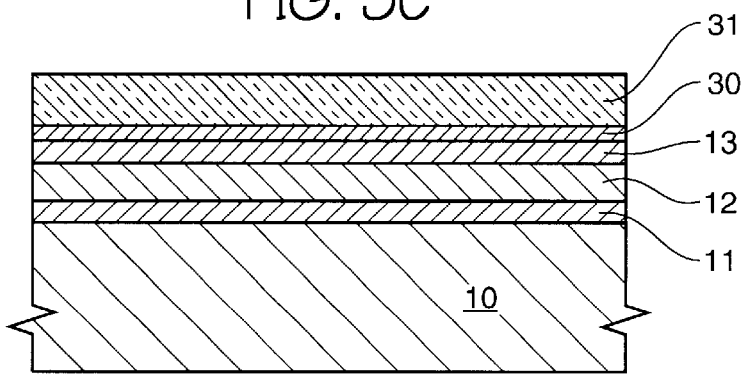

Referring now to FIG. 3d, an $SiO_x$ layer 31 is formed over Ti layer 13 by the plasma dissociation as described for FIG. 3a. During this dissociation, not only is the $SiO_x$ layer 31 formed over Ti layer 13, but TiN layer 14 is converted to an interfacial layer 30 that comprises Ti/O/N layer 30 and adheres Ti layer 13 to $SiO_x$ layer 31.

Figure 3E:
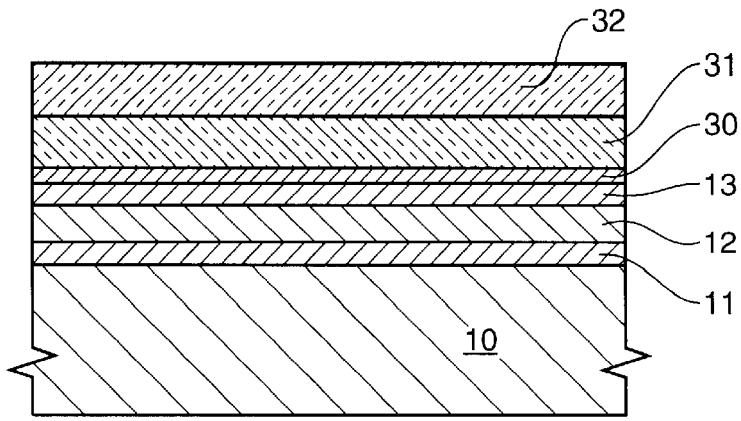

Referring now to FIG. 3e, a second $SiO_2$ layer 32 is formed on the first $SiO_2$ layer 32 by methods known to those skilled in the art.

It is to be understood that although the present invention has been described with reference to several embodiments, various modifications or other combinations of these embodiments, may be made to the structure and process steps presented herein without departing from the invention as recited in the several claims appended hereto.

What is claimed is:

1. A semiconductor fabrication process for adhering silicon dioxide to metal comprising the steps of:

sputter cleaning a metal material using argon plasma at a pressure range of 10–50 mTorr, at an energy range of 100–500 W RF power, at an argon flow rate of approximately 20–70 sccm and at a time period of approximately 5–50 sec;

converting a surface of said metal material to a metal nitride to form said metal nitride on a remaining portion of non-converted metal material; and forming silicon dioxide superjacent to said metal nitride.

2. The process of claim 1, wherein said metal material comprises titanium.

3. The process of claim 1, wherein sputter cleaning further comprise using argon plasma at a pressure of approximately 30 mTorr, at an energy of approximately 200 W RF power, at an argon flow rate of approximately 50 sccm and at a time period of approximately 10 sec.

4. The process of claim 3, wherein said sputter cleaning further comprises employing a magnetic field of approximately 60 Gauss.

5. The process of claim 1, wherein said converting of said metal material to a metal nitride comprises subjecting said metal material to plasma nitridation.

6. The process of claim 5, wherein said plasma nitridation comprises $N_2+NH_3$ plasma.

7. The process of claim 5, wherein said subjecting said metal material to plasma nitridation further comprises placing said metal material in an $N_2/NH_3$ ambient for approximately 15 sec, at a pressure of approximately 4.5 Torr, at an temperature of approximately 360° C. and at an energy of approximately 350 W RF power.

8. The process of claim 7, wherein a ratio of $N_2:NH_3$ is approximately 10:1.

9. The process of claim 6, wherein said subjecting said metal material to plasma nitridation further comprises placing said metal material in an $N_2/NH_3$ ambient for a time period range of 5–50 sec, at a pressure range of 2–9 Torr, at a temperature range of 200–450° C. and at an energy range of approximately 200–500 W RF power.

10. The process of claim 9, wherein a ratio of $N_2:NH_3$ is in the range from 2:1 to 50:1.

11. A semiconductor fabrication process for adhering silicon dioxide to titanium comprising the steps of:

sputter cleaning a titanium material using argon plasma at a pressure of approximately 30 mTorr, at an energy of approximately 200 W RF power, at an argon flow rate of approximately 50 sccm and at a time period of approximately 10 sec;

converting a surface of said titanium material to titanium nitride to form said titanium nitride on a remaining portion of non-converted titanium material; and forming a silicon dioxide layer superjacent to said titanium nitride.

12. The process of claim 11, wherein said sputter cleaning further comprises employing a magnetic field of approximately 60 Gauss.

13. The process of claim 11, wherein said converting of the titanium material at the surface of said titanium material to titanium nitride comprises subjecting said titanium material to plasma nitridation.

14. The process of claim 13, wherein said plasma nitridation comprises $N_2+NH_3$ plasma.

15. The process of claim 13, wherein said step of subjecting said titanium material to plasma nitridation further comprises placing said titanium material in an $N_2/NH_3$ ambient for approximately 15 sec, at a pressure of approximately 4.5 Torr, at a temperature of approximately 360° C. and at an energy of approximately 350 W RF power.

16. The process of claim 15, wherein a ratio of $N_2:NH_3$ is approximately 10:1.

\* \* \* \* \*